United States Patent
Indrakanti et al.

(10) Patent No.: US 8,668,835 B1
(45) Date of Patent: Mar. 11, 2014

(54) METHOD OF ETCHING SELF-ALIGNED VIAS AND TRENCHES IN A MULTI-LAYER FILM STACK

(71) Applicant: Lam Research Corporation, Fremont, CA (US)

(72) Inventors: Ananth Indrakanti, Fremont, CA (US); Bhaskar Nagabhirava, Albany, NY (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/748,249

(22) Filed: Jan. 23, 2013

(51) Int. Cl.
*H01B 13/00* (2006.01)

(52) U.S. Cl.
USPC .............................. 216/17; 438/700; 438/694

(58) Field of Classification Search
USPC .............................. 216/17; 438/689, 694, 700
See application file for complete search history.

(56) References Cited

U.S. PATENT DOCUMENTS

| | | | |
|---|---|---|---|
| 6,037,547 A | 3/2000 | Blish, II | |
| 6,124,201 A | 9/2000 | Wang et al. | |
| 6,400,030 B1 | 6/2002 | Wang et al. | |
| 6,559,049 B2 | 5/2003 | Chen et al. | |
| 6,743,711 B2 | 6/2004 | Kim | |
| 6,825,098 B2 | 11/2004 | Gabric et al. | |
| 6,921,724 B2 | 7/2005 | Kamp et al. | |
| 6,949,203 B2 | 9/2005 | Hsieh et al. | |
| 7,049,221 B2 | 5/2006 | Deguchi et al. | |
| 7,078,350 B2 | 7/2006 | Kim et al. | |
| 7,091,612 B2 | 8/2006 | Kumar et al. | |
| 7,115,517 B2 | 10/2006 | Ye et al. | |
| 7,132,369 B2 | 11/2006 | Delgadino et al. | |
| 7,141,505 B2 | 11/2006 | Nguyen et al. | |
| 7,206,184 B2 | 4/2007 | Ennis | |
| 7,253,115 B2 | 8/2007 | Tanaka et al. | |
| 7,309,448 B2 | 12/2007 | Chae et al. | |
| 7,319,067 B2 | 1/2008 | Chou et al. | |
| 7,326,650 B2 | 2/2008 | Kihara et al. | |
| 7,354,859 B2 | 4/2008 | Nagase | |
| 7,358,182 B2 | 4/2008 | Baks et al. | |
| 7,361,607 B2 | 4/2008 | Yamaguchi et al. | |
| 7,378,343 B2 | 5/2008 | Chen et al. | |
| 7,432,194 B2 | 10/2008 | Chou et al. | |
| 7,491,640 B2 | 2/2009 | Nagase | |
| 7,547,635 B2 | 6/2009 | Eppler et al. | |

(Continued)

*Primary Examiner* — Robert Culbert (74) *Attorney, Agent, or Firm* — Buchanan Ingersoll & Rooney PC (57) ABSTRACT

A multi-step etch process wherein elliptical via openings and trench openings are formed in a dielectric layer includes supporting a multi-layer film stack on a temperature controlled electrostatic chuck in a plasma etch reactor. The multi-layer film stack has a dielectric layer and a patterned metal hard mask layer above the dielectric layer. An etchant gas is supplied to the plasma etch reactor. The etchant gas is energized into a plasma state, and via openings in a photo resist are transferred into a planarization layer and then into elliptical portions of the trench openings in a patterned hard mask layer while maintaining the chuck at a temperature of about 30 to 50° C. The elliptical openings are extended into a lower layer of the hard mask and into an underlying dielectric layer while maintaining the chuck at a temperature of 20° C. or below. After stripping the planarization layer to expose the trench pattern in the hard mask, trench openings are formed in the dielectric layer while maintaining the chuck at a temperature of about 55° C. or higher. The process can thus provide enlarged via contact areas while etching trenches with pitches of 80 nm or less.

20 Claims, 6 Drawing Sheets

(56) References Cited

U.S. PATENT DOCUMENTS

| | | |
|---|---|---|
| 7,618,889 B2 | 11/2009 | Naik |
| 7,741,224 B2 | 6/2010 | Jiang et al. |
| 7,935,640 B2 | 5/2011 | Feurprier |
| 8,076,239 B2 | 12/2011 | Kawamura et al. |
| 8,084,357 B2 | 12/2011 | Chen et al. |
| 8,105,942 B2 | 1/2012 | Choi et al. |
| 8,114,769 B1 | 2/2012 | Srivastava et al. |
| 8,143,138 B2 | 3/2012 | Patz et al. |
| 8,158,524 B2 | 4/2012 | Chi et al. |
| 8,173,451 B1 | 5/2012 | Tian et al. |
| 8,222,155 B2 | 7/2012 | Takeshita et al. |
| 8,241,511 B2 | 8/2012 | Kushibiki et al. |
| 8,252,192 B2 | 8/2012 | Lee et al. |
| 2001/0002331 A1 | 5/2001 | Miyata |
| 2003/0119305 A1 | 6/2003 | Huang et al. |
| 2007/0218681 A1 | 9/2007 | Yoshida |
| 2007/0224827 A1 | 9/2007 | Xiao et al. |
| 2007/0232048 A1 | 10/2007 | Miyata et al. |
| 2008/0110859 A1 | 5/2008 | Koshiishi et al. |
| 2008/0253670 A1 | 10/2008 | Tanigawa |
| 2011/0253670 A1 | 10/2011 | Zhou et al. |
| 2011/0306214 A1 | 12/2011 | Zin |
| 2012/0064713 A1 | 3/2012 | Russell et al. |
| 2012/0214281 A1 | 8/2012 | Tomita et al. |
| 2012/0217651 A1 | 8/2012 | Cotte et al. |
| 2012/0248609 A1 | 10/2012 | Tomita |
| 2012/0276735 A1 | 11/2012 | Tagami |
| 2012/0276752 A1 | 11/2012 | Rangarajan et al. |
| 2013/0157441 A1* | 6/2013 | Han .............................. 438/478 |

* cited by examiner

METHOD OF ETCHING SELF-ALIGNED VIAS AND TRENCHES IN A MULTI-LAYER FILM STACK

FIELD OF THE INVENTION

The invention relates to methods of processing a semiconductor substrate in a plasma processing apparatus, and more specifically to selectivity control of film layers comprised in the semiconductor substrate.

BACKGROUND

In the processing of a substrate, e.g., a semiconductor substrate or a glass panel such as one used in flat panel display manufacturing, plasma is often employed. As part of the processing of a substrate (chemical vapor deposition, plasma enhanced chemical vapor deposition, physical vapor deposition, atomic layer deposition, etc.), the substrate is divided into a plurality of dies, or rectangular areas, each of which will become an integrated circuit. The substrate is then processed in a series of steps in which materials are selectively removed (etching) and deposited (deposition) in order to form electrical components thereon.

Integrated circuits are sequentially created by forming conductive patterns on dielectric layers on a substrate. In an exemplary plasma process, a substrate is coated with a thin film of hardened emulsion (i.e., such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$, etc.) are then flowed into the chamber and struck by a set of RF frequencies to form a plasma to etch exposed areas of the substrate. By controlling the amount of ion energy in the plasma through adjustments in a set of RF frequencies, the etch process is optimized.

In a common substrate manufacturing method, known as dual damascene, dielectric layers are electrically connected by a conductive plug filling a via hole. Generally, an opening is formed in a dielectric layer, which is then filled with a conductive material (e.g., aluminum (Al), copper (Cu), etc.) that allows electrical contact between two sets of conductive patterns. This establishes electrical contact between active regions on the substrate, such as interconnect layers in the multi-layer film stack. Excess conductive material on the surface of the dielectric layer is typically removed by chemical mechanical polishing (CMP).

However, escalating requirements for high circuit density on substrates may be difficult to satisfy using current plasma processing technologies where sub-micron via contacts and trenches have high aspect ratios. The utilization of new low-k films and complex film stacks present a new set of challenges for dielectric etch processes and equipment.

SUMMARY

Disclosed herein is a method of etching self-aligned vias and trenches in a multi-layer film stack supported by a temperature controlled electrostatic chuck in a plasma processing apparatus wherein the temperature controlled electrostatic chuck adjusts the temperature of the multi-layer film stack during etching of the self-aligned vias and trenches. The method comprises etching via openings into a planarization layer beneath a previously patterned photo resist mask while maintaining the multi-layer film stack at a temperature of about 30 to 50° C., the planarization layer overlying and filling trench openings in a metal hard mask previously patterned to form trenches, the via openings in the planarization layer being larger than the trench openings, the etching being carried out until planarization material in the trench openings is removed and elliptical via openings are formed in areas of the trench openings where the planarization material is removed. In a subsequent step, elliptical via openings are etched into a hard mask layer beneath the metal hard mask while maintaining the multi-layer film stack at a temperature of about 0 to 20° C. Then, elliptical via openings are etched into a dielectric layer beneath the hard mask layer by transferring the pattern of elliptical via openings in the hard mask layer into the dielectric layer and continuing the etching until the elliptical via openings reach an etch stop layer beneath the dielectric layer while the multi-layer stack is maintained at a temperature below about 50° C. After stripping the planarization layer to expose the pattern of trench openings in the metal hard mask, trenches are etched into the dielectric layer by transferring the pattern of trench openings in the hard mask layer into the dielectric layer, while etching the elliptical via openings through the etch stop layer, wherein the trench etch is performed while the multi-layer stack is maintained at a temperature of above about 55° C.

Additionally disclosed herein is a method of etching self-aligned vias and trenches in a multi-layer film stack wherein patterns of openings in layers of the multi-layer film stack are transferred into one or more underlying layers of the multi-layer film stack by performing a multi-step plasma etching process in a plasma etching apparatus wherein a semiconductor substrate is supported on a temperature controlled chuck. In one step, a pattern of via openings having a critical dimension (CD1) in a patterned mask layer is transferred into an underlying planarization layer, wherein the planarization layer overlies and fills a pattern of trench openings having a critical dimension (CD2) in a patterned hard mask layer, CD1 is larger than CD2 and at least some of the via openings in the patterned mask layer are vertically aligned with the trench openings in the hard mask layer. In another step, the pattern of via openings in the planarization layer is transferred into the filled trench openings in the hard mask layer so as to form elliptical via openings, the elliptical via openings having critical dimensions CD1 in a direction along a length of the trenches and critical dimensions CD2 in a transverse direction across a width of the trenches. In another step, the pattern of elliptical via openings is transferred into an underlying dielectric layer. After stripping the planarization layer such that the patterned hard mask layer is exposed, the pattern of trench openings in the hard mask layer is transferred into the underlying dielectric layer such that at least some of the trenches are formed over the elliptical via openings and the elliptical via openings are extended further into the dielectric layer, the trench openings and elliptical via openings having substantially the same critical dimension CD1 in the transverse direction.

DETAILED DESCRIPTION

The present invention will now be described in detail with reference to a few preferred embodiments thereof as illustrated in the accompanying drawings. In the following description, numerous specific details are set forth in order to provide a thorough understanding of embodiments disclosed herein. It will be apparent, however, to one skilled in the art, that embodiments may be practiced without some or all of these specific details. In other instances, well known process steps and/or structures have not been described in detail in order to not unnecessarily obscure the present invention.

In plasma etching vias and trenches, faceting, material encroachment, and/or corner sputtering (generically, etch profile) of films in a multi-layer film stack, can be controlled by substrate temperature. To control substrate temperature, the substrate can be supported on a temperature controlled electrostatic chuck ("TC-ESC") in a plasma processing system. Selectivity of etching film materials may be increased or decreased by controlling the temperature of the substrate, wherein the temperature of the substrate is increased or decreased by the TC-ESC. As disclosed herein, a multi-step plasma etching process can be carried out while controlling substrate temperature in order to minimize faceting, material encroachment, and/or corner sputtering and/or provide improvements to the vertical etch profile in dielectric etches, particularly in limiting faceting in a metal hard mask layer material. Such temperature control can be supplemented by controlling ion energy through control of the bias RF signal, particularly to the frequency component of the bias RF signal. Exemplary examples of enhancing selectivity based on bias RF signals are disclosed in commonly-assigned U.S. Pat. No. 8,222,155, which is hereby incorporated by reference in its entirety According to an embodiment, a trench-over-via etching process is carried out such that trenches having top critical dimensions (CDs) of about the same size as top via CDs while providing elliptical contact areas at the bottoms of the vias. As used herein "elliptical" refers to vias which have non-circular cross-sections and preferably have CDs in a direction transverse to the direction of the trenches of about 1.5 to 2 times larger than CDs in a longitudinal direction parallel to the trenches. The trenches preferably have a pitch of about 80 nm or less and the trench CDs are preferably 40 nm or less. The elliptical vias can be formed using a mask with circular openings of about 50 nm in diameter. The trenches are defined by a hard mask previously patterned to form trench openings with a CD of about 40 nm or less. The vias formed by the 50 nm openings are reduced in the transverse direction to about 40 nm and maintain the 50 nm dimension in the longitudinal direction to form the elliptical vias below the hard mask. Thus, for trench pitches of 80 nm or less, large contact areas can be provided at the bottom of the vias.

There are generally two approaches in manufacturing dual damascene substrates: via-first and trench-first. In one example of the via-first methodology, the substrate is first coated with photoresist and then the vias are lithographically patterned. Next, an anisotropic etch cuts through a multi-layer mask material, a hard mask layer, and etches through the low dielectric layer of the substrate, and stops at an etch stop barrier layer, just above the underlying metal layer. Next, the via photoresist layer is stripped, and the trench photoresist is applied and lithographically patterned. Some of the photoresist will remain in the bottom of the via and prevent the lower portion via from being over-etched during the trench etch process. A second anisotropic etch then cuts through the multi-layer mask material and etches the low dielectric material down to a desired depth. This etch forms the trench. The photoresist is then stripped and the etch stop barrier layer at the bottom of the via is opened with a low energy etch such that the underlying copper may not sputter into the via. As described above, the trench and via are filled with a conductive material (e.g., aluminum (Al), Copper (Cu), etc.) and polished by chemical mechanical polishing (CMP). The via first approach has been widely adopted for small geometry devices because it avoids the photoresist pooling effect which occurs when the trenches are formed before the vias, however the via first approach may be prone to photoresist poisoning.

An alternate methodology is trench-first. In one example, the substrate is coated with photoresist and a trench lithographic pattern is applied. An anisotropic dry etch then cuts through the multi-layer mask, the hard mask layer, and is followed by stripping the photoresist. Another photoresist layer is applied over the trench hard mask and then the vias are lithographically patterned. A second anisotropic etch then cuts through the hard mask layer and partially etches down into the low-K material. This etch forms the partial vias. The photoresist is then stripped for trench etch over the vias with the hard mask. The trench etch then cuts through the hard mask layer and partially etches the low-K material down to desired depth. This etch also clears via holes at the same time stopping on the final etch stop barrier layer located at the bottom of the via. The final etch stop barrier layer is then opened with a low energy etch such that the underlying copper may not sputter into the via. The trench-first methodology may reduce photoresist poisoning.

Figure 1:
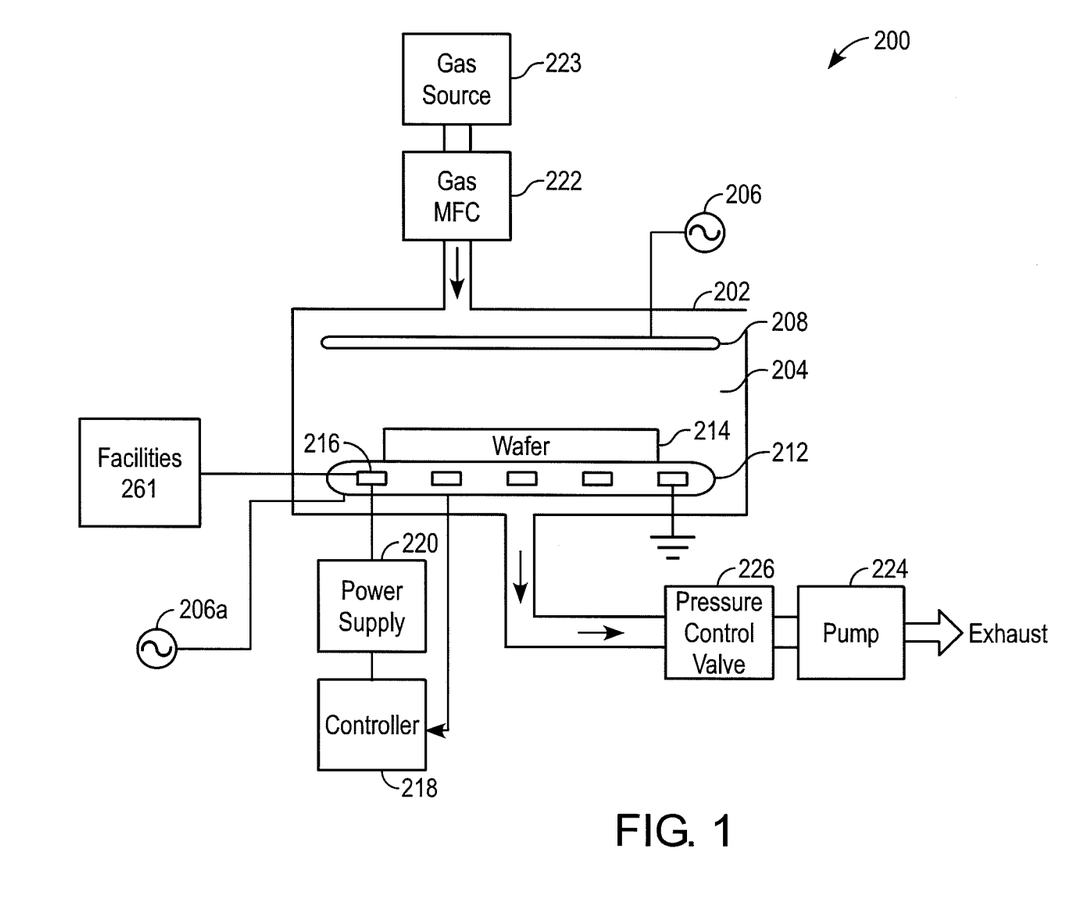
FIG. 1 is a block diagram of a plasma processing apparatus used to carry out the methods according to embodiments disclosed herein.

FIG. 1 is a block diagram of a plasma processing apparatus used to carry out the methods according to embodiments disclosed herein. FIG. 1 illustrates a capacitively coupled plasma etching system 200 used in the processing and fabrication of semiconductor devices. In alternate embodiments an inductively coupled plasma processing system could be utilized. The capacitively coupled plasma processing system 200 includes a plasma reactor 202 having a plasma chamber 204 therein. A variable power supply 206 is coupled to an upper electrode 208 influencing the plasma 210 created within plasma chamber 204.

A temperature controlled ESC 212 supports a substrate 214 to be processed. A variable power supply 206a can be coupled to the TC-ESC 212 influencing the plasma 210 created within plasma chamber 204. Additionally, the TC-ESC 212 may be grounded. In accordance with one specific embodiment of the present invention, the TC-ESC includes one or more temperature control mechanisms 216 embedded within the TC-ESC to heat or cool the substrate 214. A temperature controller 218 controls the temperature of the TC-ESC 212 via a power supply 220 and facilities 261 which may include a heat exchanger that is coupled to the one or more temperature control mechanisms 216. The characteristics of the one or more temperature control mechanisms 216 and the TC-ESC 212 are discussed further below.

A gas supply mechanism 222, such as a manifold of mass flow controllers upstream, typically supplies from a gas source 223, the proper chemistry required for the manufacturing process to the interior of plasma reactor 204. An exhaust manifold 224 removes gas and some particulate matter from within plasma chamber 204. Pressure in the plasma chamber 204 is maintained by using a throttle valve 226, often of the pendulum type.

In the plasma chamber 200, the etching of a substrate 214 such as a multi-layer film stack is achieved by exposing the substrate 214 to ionized gas compounds (plasma 210) in a vacuum or low pressure atmosphere. The etching process starts when process gases are conveyed into plasma chamber 204. The RF power is delivered by variable power supplies 206, 206a which ionize the process gases. The RF power delivered by electrode 208 and TC-ESC 212 cause an ion bombardment towards the TC-ESC 212 and the substrate 214. During the etching process, the plasma 210 reacts chemically with the surface of substrate 214 to remove material not covered by a mask.

Figure 2:
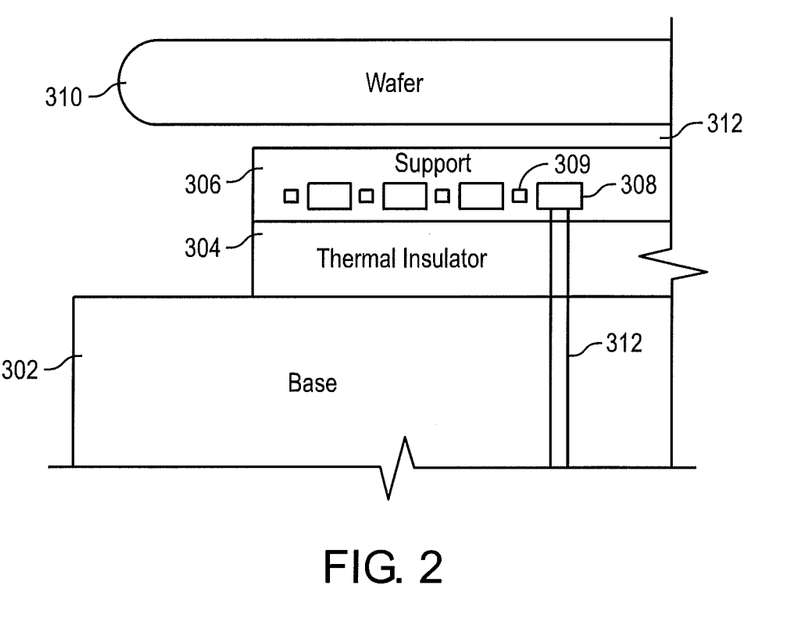
FIG. 2 is a block diagram of a temperature controlled electrostatic chuck which can be used to carry out processing methods disclosed herein.

FIG. 2 is a schematic diagram illustrating an TC-ESC 212 for controlling the temperature of a substrate 310 in accordance with one embodiment disclosed herein. An exemplary embodiment of methods of controlling the temperature of a substrate can be found in commonly-owned U.S. Pat. No. 6,921,724 which is incorporated herein in its entirety. A base 302 such as a heat exchanger supports a thermal insulator 304. A support 306, preferably flat, is mounted over the thermal insulator 304. A heater 308 is embedded in the support 306. A substrate 310, such as a multi-layer film stack, is disposed over the support 306. A thermal conductor 312 can provide intimate thermal contact between the support 306 and the substrate 310. The thermal conductor 312 may preferably be a gas, such as helium and in alternate embodiments argon. Depending on the helium pressure, the thermal conduction between the substrate 310 and the support 306 may be increased or decreased.

According to one embodiment, the base 302 comprises a metallic material, preferably an aluminum base cold plate, which is maintained at a relatively constant temperature through a conventional heat exchange system such as a cooling/heating fluid loop. According to another embodiment, the base 302 may also comprise a non-metallic material, such as aluminum nitrate. However, the base 302 must be chilled to a greater extent than in standard operation without the heater 308. For example, the temperature of the base 302 may be 10° C. to 50° C. below the desired temperature of the substrate 310. The base 302 can also provide a thermal sink for plasma heating. An external coolant chiller (not shown) may be used to maintain the temperature of the baseplate. The base 302 further has several holes or cavities (not shown) through which heater power lines 312 or other service lines are disposed. Such service lines may comprise power lines for the heater, sensors, high voltage electrostatic clamping. Those of ordinary skills in the art will recognize that the service lines are not limited to the ones previously cited.

According to one embodiment, the thermal insulator 304 acts as significant thermal impedance break between the support 306 and the base 302. The thermal insulator 304 may comprise a thick RTV bonding adhesive layer made of polymer, plastic, or ceramic. However, the thermal impedance break of the thermal insulator 304 cannot be too excessive otherwise the substrate 310 will be insufficiently cooled. For example, the thermal insulator preferably has a thermal conductivity of a range of about 0.05 W/mK to about 0.20 W/mK. The thermal insulator 304 in this case both acts as a thermal resistive element and a bond between the support 306 and the base 302. Furthermore, the thermal insulator 304 must be such that adequate RF coupling between the plasma and the base 304 is maintained. Also, the thermal insulator 304 must tolerate significant thermal-mechanical shear due to different materials and temperatures located above and below the layer. Preferably, the thickness of the thermal insulator 304 should be less than 2 mm. Thermal insulator 304 may further incorporate several cavities or vias (not shown) contiguous to the cavities of the base 304 for housing parts of the heater power lines 312 and other service lines. In alternate embodiments the thermal insulator 304 can be a gas plate or more preferably a gas plate (not shown) can accompany the thermal insulator 304 between the base 302 and the support 306. Preferably the optional gas plate may comprise fluidly isolated gas zones in an interior wherein a gas such as helium may be supplied to each fluidly isolated gas zone to adjust the thermal conductance therein.

According to one embodiment, the support 306 comprises a ceramic material. The ceramic may be a non-electrically conductive material, such as alumina. The shape of the support 306 may preferably include a conventional disk commonly used in plasma etching systems. The support 306 is preferably a conventional electrostatic chuck, but alternatively may be a ceramic having a mechanical clamp for holding down the substrate 310. According to one embodiment, the thickness of the support 306 is about 2 mm. However, one of ordinary skill in the art will recognize that other thicknesses may also be suitable. According to another embodiment, the support 306 construction is of a "thin disk bonded to a base" type, otherwise the lateral conduction may be so high that the heater input will be spread laterally resulting in an ineffective zone separation. The support should allow the heat to dissipate locally.

The heater 308 can comprise at least one resistive element. According to one embodiment, the heater 308 may be embedded in the support 306 below the clamp electrode plane and be shaped in any desirable pattern, for example, symmetrical or arbitrary. The heater 308 may also have one or more planar heating elements. Each heating element defines a heating zone or region that may be controlled independently. The multi-zone pattern has one or more planar heating elements acting in opposition to the conduction cooling to the support 306. A sensor 309 associated with each heating zone may measure the temperature for each heating zone and send a signal to a controller or computer system, such as controller 218 of FIG. 1, to monitor and control each individual planar heating element. For example, a sensor such as an infrared emission sensor or thermo-couple sensor can be mounted either through ports to read directly from the substrate 310. The sensors 309 can also be mounted within or to the back of the support 306. The heater 308 may be powered by power lines 312 disposed through openings in the thermal insulator 304 and the base 302.

According to one embodiment, heater 308 comprises an inductive heater. According to another embodiment, heater 308 comprises a heating lamp, such as krypton or quartz lamp. According to yet another embodiment, heater 308 comprises thermoelectric modules that can cool or heat. With thermoelectric modules, a base and a thermal break may be optional. Heater 308 may also comprise resistive heating elements. One of ordinary skills in the art will recognize that many other ways exist to heat and cool support 306.

Figure 3A:
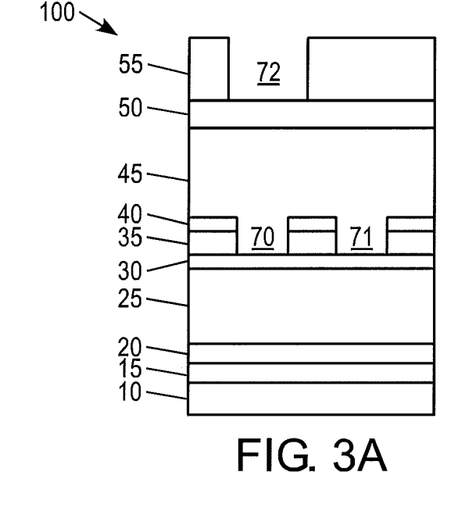
FIGS. 3A-H illustrate a process for forming a self-aligned via in accordance with an embodiment disclosed herein.
Figure 3B:
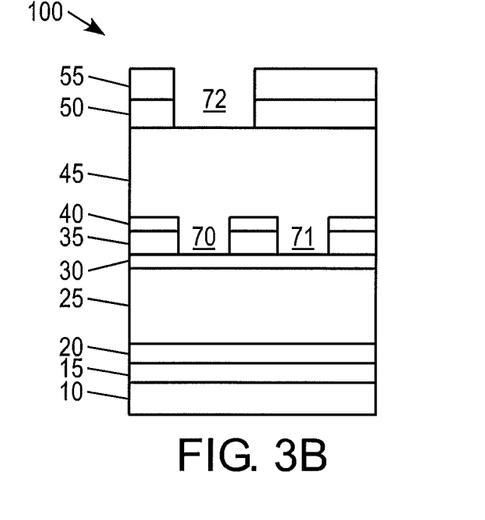
Figure 3C:
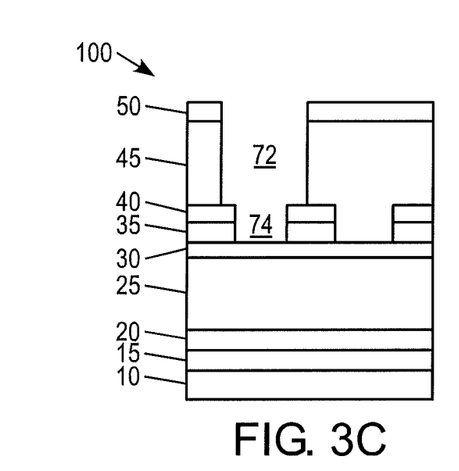

To facilitate discussion, FIG. 3A illustrates an idealized cross-sectional view of a multi-layer film stack 100, representing the layers of an embodiment of a semiconductor device after a repeating pattern of openings 70, 71 have been etched in the multi-layer film stack 100 and subsequently masked. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers. Further, the term "about" and "substantially" should be construed to encompass values within +/−10% of the stated value.

Selectivity of processing materials comprised in a substrate such as multi-layer film stack 100 can be controlled dependent on process recipes. For example, a process recipe can include: (1) selecting an amount of the process gas and/or constituent of the process gas; (2) selecting a process pressure and one or more power levels for forming plasma; (3) selecting a substrate temperature; and (4) selecting an etch time, wherein parameters 1-3 may be adjusted over time.

As will be appreciated, a portion of a multi-layer film stack 100 in FIG. 3A is shown configured at an initial mask stage for patterning vias and trenches (for eventual fabrication of a second metal line/layer and vias between a first metal line/layer and the second two metal line/layer). At the base of multi-layer film stack 100, there is shown an oxide layer 10, comprising for example $SiO_2$. Substrates such as multi-layer film stack 100 may further comprise various dielectric and metal layers (not shown), such as conductor lines of aluminum or copper which may be comprised in the oxide layer 10. Above oxide layer 10 is disposed a dielectric barrier layer 15 (e.g. BLoK™ available from Applied Materials, Santa Clara, Calif.), which preferably is a nitride, carbide, or carbonitride such as SiN, SiC, SiCN, or SiCHN, having a dielectric constant of about 4.3 to 5. Above the barrier layer 15 is an etch stop layer 20 ("ES1 layer"), which can be composed of SiN, SiC, phosphosilicate glass (PSG), and the like. The ES1 layer 20 preferably has a higher dielectric constant (i.e. k>5) than the barrier layer 15 and a porous low-k dielectric layer ("PLKD layer") 25 disposed above the ES1 layer 20. The ES1 layer 20 may preferably have a dielectric constant of about 5 and 9. The PLKD layer 25, preferably comprises an ultra low-K material (e.g., SiOC, etc.) wherein the PLKD layer 25 comprises a dielectric constant of about 1 to 4.3 and more preferably of about 1.8 to 3. Located above the PLKD layer 25, is a first hard mask layer ("HM1 layer") 30, which can be a silicon oxide film such as tetraethyl orthosilicate ("TEOS") based film, silicon dioxide, silicon nitride, silicon carbide, SiOC, SiON, SiCN, and combinations thereof. Above the HM1 layer 30, there may be disposed a metal hard mask layer ("MHM layer") 35. Above the MHM layer 35 is a second hard mask layer ("HM2 layer") 40 which is preferably formed from a material that can be used for the HM1 layer, such as a TEOS film.

The multi-layer film stack 100 can comprise openings 70, 71, 72. Preferably, the MHM layer 35 and the HM2 layer 40 have been previously patterned through an etching process which formed trench openings 70, 71 to later form trenches and the openings 72 will open vias in later etching steps, as illustrated in FIGS. 3A-H which show a portion of a film stack 100 containing a pattern of trench openings 70, 71. Preferably the pattern of trench openings 70, 71 have a pitch of about 80 nm or less. In more preferable embodiments, the trench openings 70, 71 can have pitches such as 66 nm or 45 nm. The patterned MHM layer 35 may be formed from materials such as TiN, SiN, WN, WSiN, TiSiN, TaN, TaSiN, TiTaN, TaRuN, or combinations thereof. Preferably, the patterned MHM layer 35 is formed from TiN.

Above the MHM layer 35 and the HM2 layer 40 is preferably a tri-layer mask. The tri-layer mask can comprise a bottom organic planarization layer ("OPL layer") 45, an anti-reflective layer such as a bottom antireflective layer (BARC) which can be a silicon anti-reflective coating layer ("SiARC layer") 50 above the OPL layer 45, and a photoresist mask layer ("PR layer") 55 above the SiARC layer 50. In other embodiments anti-reflective coatings other than SiARC may be utilized. When the OPL layer 45 is formed, the material of the OPL layer 45 fills the openings 70, 71 in layers 35, 40. The PR layer 55 can be patterned with openings 72 such that underlying layers may be etched. As shown in FIG. 3A which illustrates a portion of a film stack 100, the PR layer 55 contains a pattern of via openings 72 (only one of which is shown in FIG. 3A. Preferably each via opening 72 is vertically aligned with a trench opening 70 such that the pattern of openings 72 may be transferred to the underlying SiARC layer 50 and OPL layer 45. While the pattern of openings 72 is transferred to the OPL layer 45, the OPL layer material 45 which filled the pattern of trench openings 70 in layers 35, 40 is removed to form elliptical openings 74. Because the openings 72 are larger than the widths of the trench openings 70, the OPL material removed from the trench opening 70 forms an elliptical opening having a CD in a transverse direction equal to the width of the trench opening and a CD2 in a direction along the trench (in the direction into the plane of the paper) which is larger than CD1. Film stack layers underlying opening 72 may be removed while opening 71 remains masked by PR layer 55 allowing for patterned trench and/or via holes (as described and illustrated further below) to be eventually be formed within the PLKD layer 25 during subsequent processing steps. Preferably the PR layer 55 is 193 nm photoresist. Alternatively, 248 nm photoresists, 157 nm photoresists, EUV resists, or electron sensitive resists may be used. The unmasked patterned trench and/or via holes may be removed in a plasma etching process (i.e. removal process) utilizing any suitable processes, including for example a reactive ion etching (RIE). It will be appreciated that the openings 70, 71, 72 illustrated in FIG. 3A may include additional and/or alternate patterning and/or the pattern illustrated may be repeated across the larger wafer 214 (see FIG. 1). Preferably the arrangement of the pattern of openings 70, 71, 72 is repeated in integrated circuits across the wafer 214.

As shown in FIG. 3A, the opening 72 in PR layer 55 is aligned with opening 70 in the HM2 layer 40 and the MHM layer 35. Because the opening 70 is smaller in width than the size of the opening 72, an elliptical via 74 will be formed in the portion of the OPL material removed from the trench opening 70. The opening 71 in layers 40, is masked by layers 45, 50, 55. Such patterning allows trench-over-via etching to be performed. The etching process first transfers the opening 72 of the PR layer 55 to the unmasked portions of the SiARC layer 50 (see FIG. 3B) exposing an upper surface of the OPL layer 45 within opening 72. Then in a next step, the opening 72 of the SiARC layer is transferred to the OPL layer 45. The opening 72 is transferred such that an upper surface of the HM2 layer 40 is exposed within opening 72 and the OPL layer material filling opening 70 in the MHM layer 35 and the HM2 layer 40 is removed such that opening 70 exposes an upper surface of the HM1 layer 30 (see FIG. 3C). During the etching of the OPL layer 45, the PR layer 55 may be fully removed exposing previously masked portions of the SiARC layer 50. Additionally, during the etching of the OPL layer 45 after the PR layer 55 is fully removed the thickness of the underlying SiARC layer 50 may be reduced. In essence an elliptical version of each opening 72 in the PR layer 55 will be transferred to the SiARC and OPL layers 50, 45 until the HM1 layer 30 is exposed in the elliptical opening 74 of the HM2 and the MHM layers 40, 35. The material of the HM2 and the MHM layers 40, 35 defining the elliptical opening 74 provides a mask for etching into the HM1 layer 30. In a preferred embodiment, the openings 72 are circular with a diameter of about 50 nm. At this point in the process, it will be appreciated that the unexposed corner portions of the patterned MHM layer 35 will become exposed in subsequent etching steps and provide a future mask for the eventual trenches and/or vias in the multi-layer film stack 100.

Figure 3D:
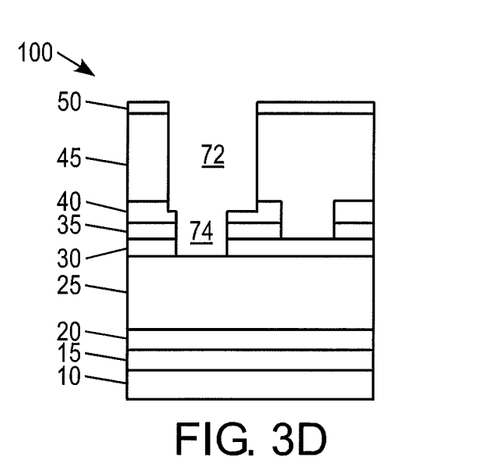

After the patterned portions of the OPL layer 45 have been removed from openings 72, 70 to form elliptical openings 74, the multi-layer film stack 100 undergoes processing such that the pattern of elliptical openings 74 is transferred to the HM1 layer 30 in a hard mask opening step. The hard mask opening step exposes an upper surface of the MHM layer 35 within the opening 72 and exposes the PLKD layer 25 within elliptical opening 74 as shown in FIG. 3D. The MHM layer 35 forms a mask for later etching steps. During the hard mask opening step, the SiARC layer 50 may be completely removed, or alternatively, the thickness of the masking SiARC layer 50 may be reduced. After the hard mask opening step, if a portion of the masking SiARC layer remains, a removal process may be performed utilizing any suitable process for entirely removing the SiARC layer 50, exposing the OPL layer 45 as shown in FIG. 3E.

Figure 3E:
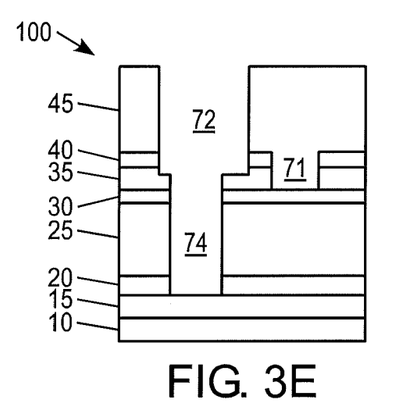

FIG. 3E illustrates the multi-layer film stack 100 after a partial via etch step has been performed. During the partial via etch step, the pattern of elliptical openings 74 of the MHM layer 35 is transferred to the PLKD layer 25 until reaching the ES1 layer 20 such that the ES1 layer 20 is partially etched to form a via (i.e. increasing the depth of the opening 74 in the multi-layer film stack 100). Preferably the partial via etch step etches the via to a target depth of about 90% of the final via depth. During the partial via etch step, the critical dimension ("CD") of the opening 72 in the OPL layer 45, which previously formed the initial opening for the patterned trench and/or via holes, is larger than the CD of the trench opening 70 comprised in the MHM layer 35 such that the via hole when formed may be elliptical. During the partial via etching step, the thickness of the MHM layer 35 at exposed portions may be reduced, however to form a self-aligned via, the PLKD layer 25 and the ES1 layer 20 should be removed without completely removing the MHM layer 35. (i.e. the etch rate of the PLKD layer 25 and underlying ES1 layer 20 should be greater than the etch rate of the MHM layer 35). Furthermore, etching of the PLKD layer 25 should be controlled such that faceting and/or corner loss to the MHM layer 35 does not reduce the trench margin for later via and/or trench etches and post-etch treatments such as a wet clean, sputter, or metallization process. A method of controlling faceting and/or corner loss to the MHM layer 35 is discussed below. After the partial via etch the MHM layer 35 may be partially eroded such that the opening 72 extends into an upper surface of the MHM layer 35.

Figure 3F:
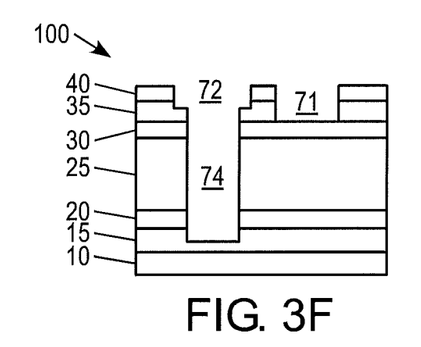

FIG. 3F shows the cross-sectional view of multi-layer film stack 100 after a subsequent step of stripping the OPL layer 45 has been performed. Stripping the OPL layer 45 fully exposes the HM2 layer 40 and removes the OPL layer material within the trench opening 71 in the MHM layer 35 and the HM2 layer 40.

Figure 3G:
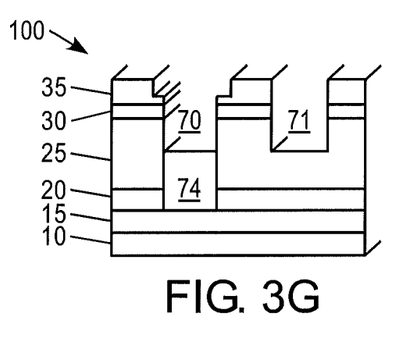

FIG. 3G illustrates the multi-layer film stack 100 after a trench etching step has been performed. During the trench etch step, trenches 70,71 are formed in the PLKD layer 25 of the multi-layer film stack 100 and the ES1 layer 20 exposed within elliptical opening 74 is removed extending the elliptical via opening 70. To form the trenches, the pattern of openings 70, 71 of the MHM layer 35 are transferred to the exposed portions of the HM1 layer 30 and subsequently the pattern of trench openings 70, 71 is transferred to a predetermined depth in the PLKD layer 25. Preferably the etch rate of the HM1 layer 30 and the PLKD layer 25 is greater than the etch rate of the ES1 layer 20. Additionally during the trench etch, the HM2 layer 40 may be removed fully exposing the MHM layer 35. Etching of the HM1 layer 30, the PLKD layer 25, and the ES1 layer 20 during the trench etch should be controlled such that faceting and/or corner loss to the MHM layer 35 does not reduce the trench margin for a later liner removal step, and post-etch treatments such as a wet clean, sputter, or metallization process. A method of controlling faceting and/or corner loss to the MHM layer 35 is discussed below.

Figure 3H:
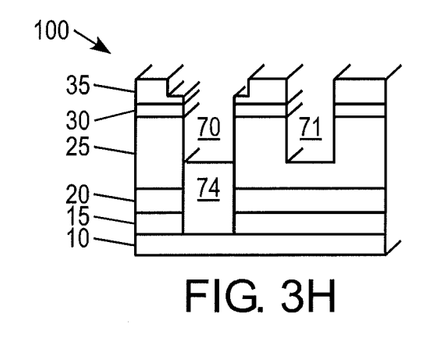

FIG. 3H illustrates the multi-layer film stack after a liner removal step has been performed. The liner removal step preferably transfers the elliptical opening 74 of the MHM layer, the HM1 layer, the PLKD layer, and the ES1 layer 20 to the barrier layer 15 and an elliptical via hole formed therefrom may be formed to a final predetermined depth.

After the elliptical via hole 74 has been formed to the final predetermined depth, the via hole may then be filled with a conductive material (e.g., aluminum (Al), copper (Cu), etc.) that allows electrical contact between two sets of conductive patterns. This establishes electrical contact between interconnect layers in the multi-layer film stack 100. Any excess conductive material on the surface of the dielectric layer may be removed by chemical mechanical polishing.

FIGS. 3A-H and the various steps used to describe the methods disclosed herein are by way of illustration only and should not be construed in any way to limit its scope. Those skilled in the art will understand that the principles described herein may be implemented with any type of suitably arranged device and/or devices.

During processing, the TC-ESC holds a multi-layer film stack, such as multi-layer film stack 100 in place and can apply a RF bias to the multi-layer film stack 100. The ion energy, and therefore the deposition and/or etch rate can also be controlled by the TC-ESC. The RF power applied is preferably between about 100 and 2000 W, and various RF frequencies supplied to a bottom and/or upper electrode can be used to achieve the biased condition, such as 2 MHz, 13.56 MHz, 27 MHz, 60 MHz, or 90 MHz. Preferably, the RF energy is supplied at two different frequencies to the bottom electrode or at different first and second frequencies to an upper electrode and bottom electrode. More preferably a 60/27 MHz plasma is used for etching steps such as the partial via etch step.

The multi-layer film stack 100 is preferably processed in a series of etching steps (i.e. transferring a pattern through the multi-layer film stack). Preferably the series of etching steps utilize the TC-ESC to control the temperature of the multi-layer film stack 100 during said series of etching steps to achieve etch selectivity between various layers in the multi-layer film stack 100. Preferably the temperature control scheme will transfer patterns to mask layers, such as the SiARC layer 50 and the OPL layer 45 of the multi-layer film stack 100, at a first temperature. Preferably the first temperature is less than about 50° C. More preferably the first temperature is of about 30 to 50° C. Then reducing the temperature of the multi-layer film stack 100 to a second temperature during subsequent transfers of patterns to underlying hard mask layers, such as the HM1 layer 30, the MHM layer 35, and the HM2 layer 40, and to underlying dielectric layers such as the PLKD layer 25 and the ES1 layer 20, to form a via opening extending partially into the ES1 layer 20. Preferably the second temperature is about 0 to 20° C. Then at a third temperature during a subsequent trench etching process, the temperature of the multi-layer film stack is preferably raised such that trenches may be patterned in the PLKD layer 25 while the via opening in the ES1 layer 20 is etched therethrough. Preferably the third temperature is above about 55° C., more preferably about 50 to 70° C.

The TC-ESC controls the temperature of the multi-layer film stack 100 wherein the temperature can be increased or decreased during etching. Helium backside gas can be used to provide thermal coupling between the multi-layer film stack 100 and the TC-ESC such that the TC-ESC may adjust the temperature of the multi-layer film stack 100 during processing. Temperatures used to process the multi-layer film stack 100 are preferably between about 0 and 110° C. Adjusting the temperature of the multi-layer film stack 100 during processing may increase or decrease selectivity of various materials comprised in layers of the multi-layer film stack 100 during etching, depending on the material being process. Preferably, the TC-ESC can increase or decrease the temperature of the multi-layer film stack at a rate of at least about 2° C. per second.

Figure 4A:
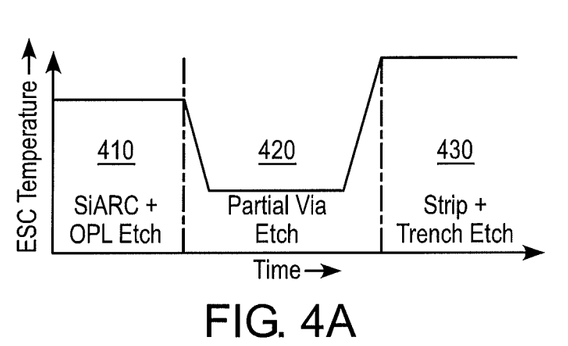
FIG. 4A illustrates an optimized graph of temperature controlled electrostatic chuck temperature during different steps of processing methods described herein.

During processing of the multi-layer film stack 100, the temperature of the multi-layer film stack 100 is preferably adjusted to increase or decrease the selectivity of materials comprised within the multi-layer film stack 100. For example, each thermal zone of the TC-ESC can be adjusted to achieve optimal etch conditions in each thermal zone. FIG. 4A illustrates an optimized graph of TC-ESC temperature during different steps of processing methods described herein. During initial processing steps 410, such as steps performed to open mask layers, such as the SiARC layer 50 and the OPL layer 45, the TC-ESC preferably maintains the temperature of the multi-layer film stack 100 between about 30° to 50° C. After the mask layers have been opened, the HM1 layer 30 is preferably opened forming the elliptical via opening 74. As a consequence of opening the exposed portion of the HM1 layer 30 within trench opening 70, portions of the HM2 layer 40 are removed at exposed locations within openings 72. Removing all of the HM2 layer 40 at unmasked locations exposes corners of the trench patterned MHM layer 35 to process gases. Exposure to process gases during the opening of the HM1 layer 30 and subsequent partial via etch may cause faceting and/or corner sputtering of the MHM layer 35 as well as produce etch by-products which may form residue on the multi-layer film stack 100. For example, if the MHM layer 35 is formed from TiN, etching of the TiN layer can form $TiF_x$ (wherein x<4) which is undesirable. To minimize these effects, the TC-ESC preferably reduces the temperature of the multi-layer film stack 100 during processing step 420, such that the selectivity for the MHM layer 35 is increased during the hard mask open and the partial via etch. Preferably while opening the HM1 layer 30, the TC-ESC maintains the multi-layer film stack 100 at a temperature less than about 50° C. and more preferably the TC-ESC maintains the multi-layer film stack 100 at a temperature between about 0° to 20° C. during the partial via etch. In alternate embodiments, the temperature of the multi-layer film stack 100 may be increased as the partial via etch is performed. For example, the partial via etch step may commence at temperature of between about 0° to 20° C. and may be gradually increased as etching is performed. Preferably the gradual increase of temperature will not raise the temperature of the multi-layer film stack 100 above about 50° C. during the partial via etch. In a further alternate embodiment, the temperature of the multi-layer film stack 100 may first be decreased during the initial stage of the HM1 opening step or the partial via etch and then optionally increased as the partial via etch is performed.

Figure 4B:
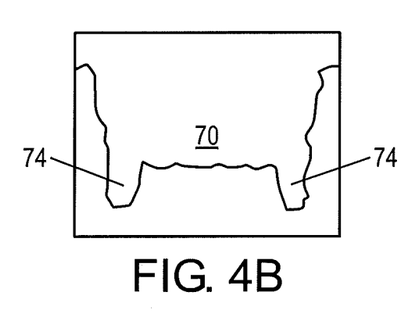
FIG. 4B illustrates a residue containing trench-over-via structure obtained when conducting the trench etch at temperatures below 50° C.
Figure 4C:
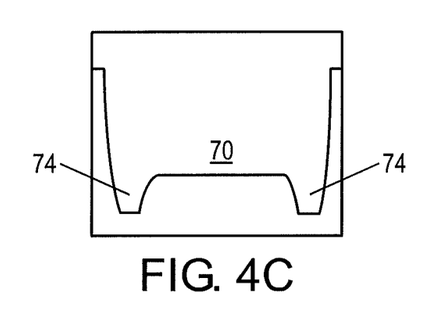
FIG. 4C illustrates a residue free trench-over-via structure obtained when conducting the trench etch at temperatures above 50° C.
Figure 4D:
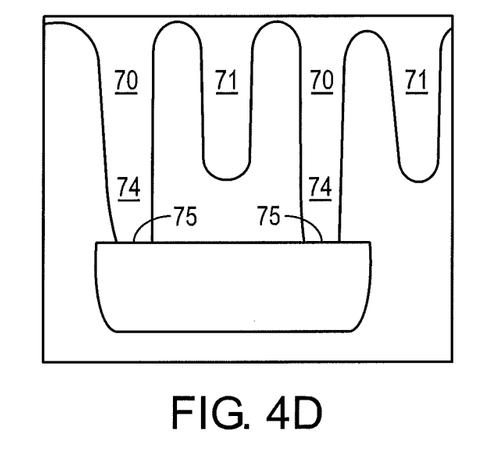
FIG. 4D illustrates a residue free trench-over-via structure having nearly equal top via CD and top trench CD.
Figure 4E:
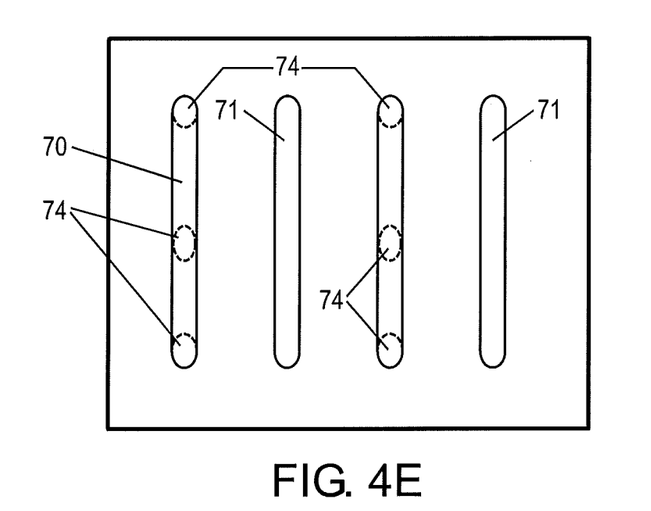
FIG. 4E illustrates a top down view of a trench-over-via structure having nearly equal top via CD and top trench CD.

Although reduced temperatures minimize faceting, MHM encroachment, and/or corner sputtering in the MHM layer 35, the reduced temperatures may also lead to the formation of MHM residues, for example Ti based residues, such as $TiF_x$ nonvolatile by-products. In addition to the formation of residues, reduced processing temperatures may also lead to angled via and trench profiles, and a decreased target CD at the base of the via. Therefore in a next processing step 430, the temperature of the multi-layer film stack 100 during processing is preferably increased and maintained at a temperature above about 55° C. such as between about 55° and 70° C. Preferably the OPL stripping step and the trench etching step are performed at the same increased temperature. Increased temperatures may reduce and even may eliminate any Ti based residue in the final trench-over-via etched structures. For example, FIG. 4B illustrates a residue containing trench-over-via structure obtained when conducting the trench etch at temperatures below 50° C. whereas FIG. 4C illustrates a residue free trench-over-via structure obtained when conducting the trench etch at temperatures above 50° C. Additionally, the increased temperatures are believed to straighten the profiles of the one or more trenches and the via hole, bringing the profiles closer to 90°. Additionally, a straighter via profile at or near the via bottom will form better electrical connections between trenches located in different layers of the multi-layer film stack. FIG. 4D illustrates a residue free trench-over-via structure having substantially straight profiles of the trenches 70, 71, nearly equal top via CD and top trench CD and a large contact area 75 at the bottom of the elliptical vias 74 wherein the contact area is at least 1.5 times longer in the direction of the trenches (extending into the plane of the paper) than the transverse direction (from left to right in FIG. 4D). FIG. 4E illustrates a top down view of a trench-over-via structure wherein elliptical vias 74 are aligned with the trenches 70, and the elliptical vias 74 and the trenches 70 have nearly equal top via CD and top trench CD. The contact area at the bottom of the elliptical vias 74 is at least 1.5 times longer in the direction of the trenches than in the transverse direction (from left to right in FIG. 4E) thus forming the elliptical shape of the vias 74.

While embodiments disclosed herein have been described in detail with reference to specific embodiments thereof, it will be apparent to those skilled in the art that various changes and modifications can be made, and equivalents employed, without departing from the scope of the appended claims.

What is claimed is:

1. A method of etching self-aligned vias and trenches in a multi-layer film stack supported by a temperature controlled electrostatic chuck in a plasma processing apparatus wherein the temperature controlled electrostatic chuck adjusts the temperature of the multi-layer film stack during etching of the self-aligned vias and trenches, the method comprising:

etching via openings into a planarization layer beneath a previously patterned photo resist mask while maintaining the multi-layer film stack at a temperature of about 30 to 50° C., the planarization layer overlying and filling trench openings in a metal hard mask previously patterned to form trenches, the via openings in the planarization layer being larger than the trench openings, the etching being carried out until planarization material in the trench openings is removed and elliptical via openings are formed in areas of the trench openings where the planarization material is removed;

etching elliptical via openings into a hard mask layer beneath the metal hard mask while maintaining the multi-layer film stack at a temperature of about 0 to 20° C.;

etching elliptical via openings into a dielectric layer beneath the hard mask layer by transferring the pattern of elliptical via openings in the hard mask layer into the dielectric layer and continuing the etching until the elliptical via openings reach an etch stop layer beneath the dielectric layer while the multi-layer stack is maintained at a temperature below about 50° C.;

stripping the planarization layer to expose the pattern of trench openings in the metal hard mask;

etching trenches into the dielectric layer by transferring the pattern of trench openings in the hard mask layer into the dielectric layer, while etching the elliptical via openings through the etch stop layer, wherein the trench etch is performed while the multi-layer stack is maintained at a temperature of above about 55° C.

2. The method of claim 1, further comprising etching the elliptical via openings into a dielectric barrier layer beneath the etch stop layer while the multi-layer stack is maintained at a temperature of above about 55° C.

3. The method of claim 1, wherein the photo resist mask is above a silicon containing anti-reflective coating (SiARC), and the planarization layer is an organic planarization layer (OPL).

4. The method of claim 1, wherein the elliptical via openings have vertical sidewalls.

5. The method of claim 1, wherein the metal hard mask is formed from a material selected from the group consisting of TiN, SiN, WN, WSiN, TiSiN, TaN, TaSiN, TiTaN, TaRuN, and combinations thereof.

6. The method of claim 1, wherein the metal hard mask layer is formed from TiN.

7. A method of etching self-aligned vias and trenches in a multi-layer film stack wherein patterns of openings in layers of the multi-layer film stack are transferred into one or more underlying layers of the multi-layer film stack by performing a multi-step plasma etching process in a plasma etching apparatus wherein a semiconductor substrate is supported on a temperature controlled chuck; the method comprising:

transferring a pattern of via openings having a critical dimension (CD1) in a patterned mask layer into an underlying planarization layer, wherein the planarization layer overlies and fills a pattern of trench openings having a critical dimension (CD2) in a patterned hard mask layer, CD1 is larger than CD2 and at least some of the via openings in the patterned mask layer are vertically aligned with the trench openings in the hard mask layer;

transferring the via openings in the planarization layer into the filled trench openings in the hard mask layer so as to form elliptical via openings, the elliptical via openings having critical dimensions CD1 in a direction along a length of the trenches and critical dimensions CD2 in a transverse direction across a width of the trenches;

transferring the elliptical via openings into an underlying dielectric layer;

stripping the planarization layer such that the patterned hard mask layer is exposed;

transferring the pattern of trench openings in the hard mask layer into the underlying dielectric layer such that at least some of the trenches are formed over the elliptical via openings and the elliptical via openings are extended further into the dielectric layer, the trench openings and elliptical via openings having substantially the same critical dimension CD1 in the transverse direction.

8. The method of claim 7, wherein the patterned mask layer includes a silicon containing antireflection layer (SiARC) beneath a photoresist patterned with circular via openings and the hard mask layer includes a metal hard mask layer between upper and lower silicon containing hard mask layers, the method including transferring the via openings into the SiARC prior to transferring the via openings into the planarization layer and transferring the elliptical via openings into the lower silicon containing hard mask layer prior to transferring the elliptical via openings into the dielectric layer.

9. The method of claim 7, wherein the patterned hard mask layer includes a lower hard mask (HM1) layer, a metal hard mask (MHM) layer over the HM1 layer, and an upper hard mask (HM2) layer over the MHM layer, the MHM layer and the HM2 layer including the patterned trench openings, the method including transferring the elliptical via openings into the HM1 layer.

10. The method of claim 9, wherein transferring the pattern of via openings in the planarization layer into the patterned hard mask layer exposes a portion of the upper surface of the MHM layer.

11. The method of claim 9, wherein the MHM layer is formed from a material selected from the group consisting of TiN, SiN, WN, WSiN, TiSiN, TaN, TaSiN, TiTaN, TaRuN and combinations thereof and the HM1 And HM2 layers are formed from a material selected from the group consisting of silicon carbide, silicon nitride, silicon oxide, SiON, TEOS and combinations thereof.

12. The method of claim 7, wherein the multilayer stack includes an etch stop layer beneath the dielectric layer and a barrier layer below the etch stop layer, the method including transferring the elliptical via openings into the etch stop layer before stripping the planarization layer, extending the elliptical via openings through the etch stop layer during the step of transferring the trench openings into the dielectric layer, and subsequently transferring the elliptical via openings into the barrier layer.

13. The method of claim 7, wherein the pattern of via openings in the patterned mask layer is transferred to the underlying planarization layer while maintaining the chuck at a temperature of about 30 to 50° C., the elliptical via openings are transferred into the dielectric layer while maintaining the chuck at a temperature below about 20° C., and the trench openings are transferred into the dielectric layer while maintaining the chuck at a temperature above about 55° C.

14. The method of claim 8, wherein the elliptical via openings are transferred into the lower silicon containing hard mask layer while maintaining the chuck below about 20° C.

15. The method of claim 7, wherein the trench openings have a pitch of 80 nm or less and the elliptical via openings have CD2 at least about 1.5 times larger than CD1.

16. The method of claim 7, wherein the patterned hard mask layer includes a TiN layer and portions of the TiN layer are exposed to plasma during etching of the pattern of trench openings in the hard mask layer into the underlying dielectric layer while maintaining the chuck at a temperature of about 50 to 70° C.

17. The method of claim 7, wherein the plasma etch reactor comprises a dual-frequency medium-density capacitively coupled plasma reactor including an upper showerhead electrode and a bottom electrode, RF energy being supplied at two different frequencies to either the bottom electrode or at different first and second frequencies to the showerhead electrode and bottom electrode.

18. The method of claim 17, wherein RF energy is supplied at two different frequencies to the bottom electrode or at different first and second frequencies to the showerhead electrode and bottom electrode wherein the frequencies of RF energy are selected from the group consisting of 2 MHz, 13.56 MHz, 27 MHz, 60 MHz, and 90 MHz.

19. The method of claim 7, wherein bottoms of the elliptical via openings contact conductive lines with contact areas having widths of about CD1 and lengths of about CD2.

20. The method of claim 7, wherein the trench openings are vertically aligned with at least two of the elliptical via openings.

\* \* \* \* \*